United States Patent [19]

Yokoyama et al.

[11] Patent Number: 4,849,934
[45] Date of Patent: Jul. 18, 1989

[54] LOGIC CIRCUIT USING RESONANT-TUNNELING TRANSISTOR

[75] Inventors: Naoki Yokoyama; Toshihiko Mori, both of Atsugi, Japan

[73] Assignee: Fujitsu Limited, Kawasaki, Japan

[21] Appl. No.: 918,300

[22] Filed: Oct. 10, 1986

[30] Foreign Application Priority Data

Oct. 12, 1985 [JP] Japan ................... 60-226004
Jun. 14, 1986 [JP] Japan ................... 61-138631

[51] Int. Cl.$^4$ ............................................ G11C 11/40
[52] U.S. Cl. ................... 365/159; 307/322; 365/174
[58] Field of Search ............... 365/151, 159, 177, 174; 357/4, 7, 57; 307/322

[56] References Cited

U.S. PATENT DOCUMENTS

| | | | |
|---|---|---|---|
| 3,246,314 | 4/1966 | Kaenel | 307/322 |
| 4,712,121 | 12/1987 | Yokoyama | 357/4 |
| 4,721,983 | 1/1988 | Frazier | 357/4 |

OTHER PUBLICATIONS

Applied Physics Letters—vol. 43 (6), Sep. 15, 1983, pp. 588–590.
Applied Physics Letters—vol. 46 (5), Mar. 1, 1985, pp. 508–510.
N. Yokoyama, et al., A New Function, Resonant-Tunneling Hot Electron Transistor (RHET), Nov. 1985, Japanese Journal of Applied Physics, vol. 24, No. 11, pp. L853–L854.

*Primary Examiner*—James W. Moffitt
*Attorney, Agent, or Firm*—Staas & Halsey

[57] ABSTRACT

A logic circuit including a resonant-tunneling transistor having a superlattice containing at least one quantum well layer, and a constant current source operatively connected between a base and an emitter of the transistor and supplying a constant current to said base. The transistor has a differential negative-resistance characteristic with at least one resonant point in a relationship between a current flowing in the base and a voltage between the base and emitter, and having at least two stable base current values at both sides of the resonant point on the characteristic, defined by the changeable base-emitter voltage. By supplying the base-emitter voltage having an amplitude of at least two amplitudes corresponding to the stable base current values, the transistor holds data corresponding to the base-emitter voltage.

25 Claims, 19 Drawing Sheets

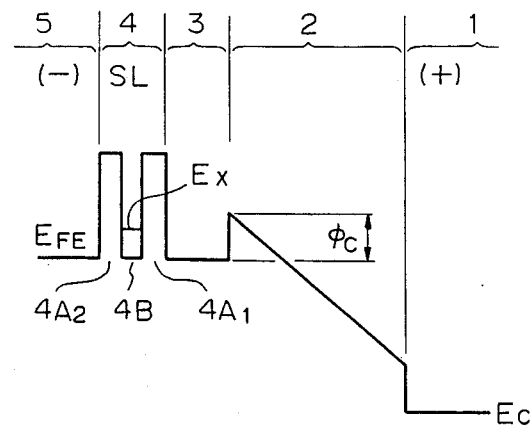
Fig. 3a $V_{BE} < 2E_x/q$
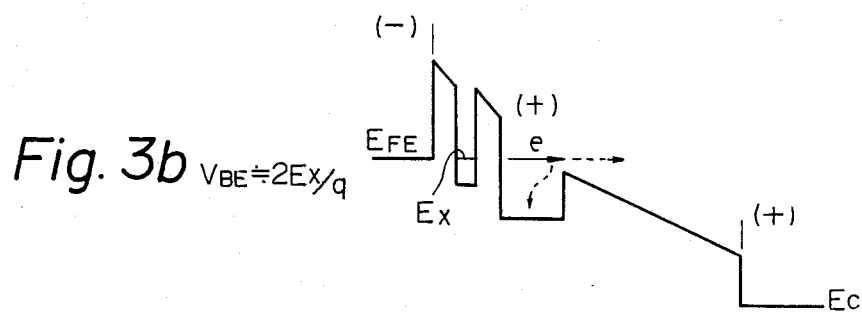
Fig. 3b $V_{BE} \doteq 2E_x/q$
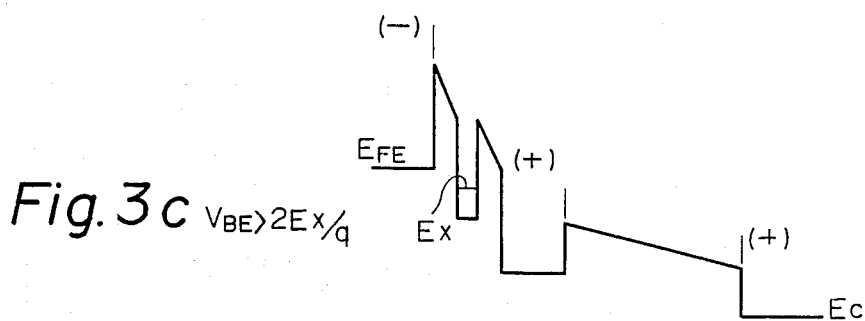
Fig. 3c $V_{BE} > 2E_x/q$

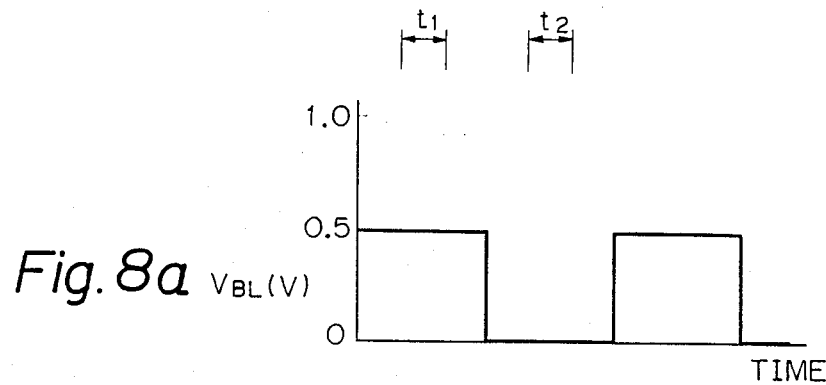
Fig. 8a  $V_{BL}(V)$
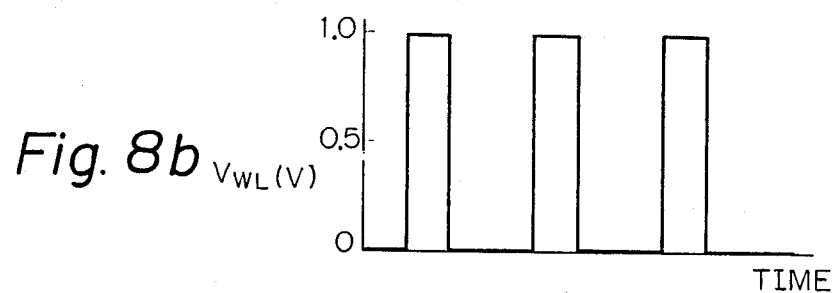
Fig. 8b  $V_{WL}(V)$
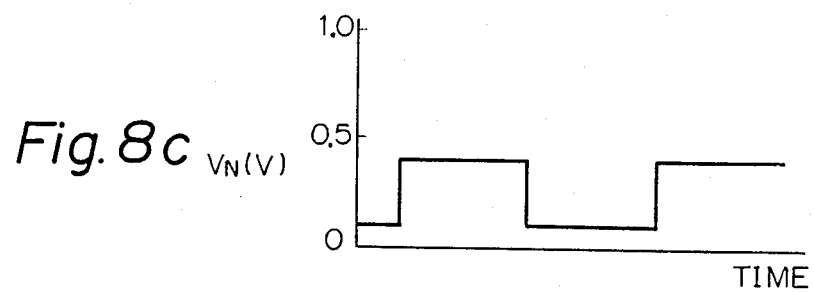
Fig. 8c  $V_N(V)$

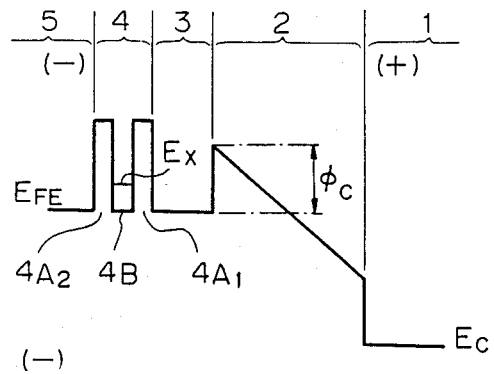
Fig.11a $V_{BE} \fallingdotseq 0$
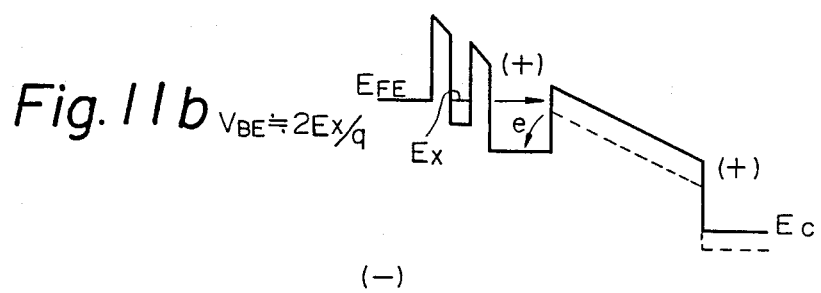
Fig.11b $V_{BE} \fallingdotseq 2E_x/q$
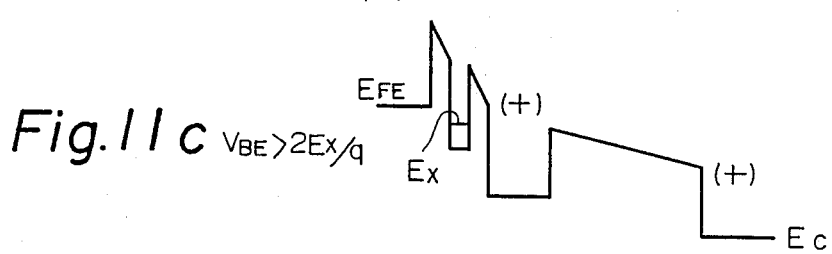
Fig.11c $V_{BE} > 2E_x/q$
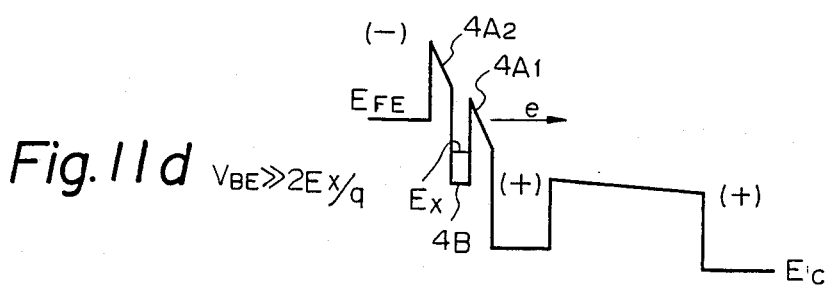
Fig.11d $V_{BE} \gg 2E_x/q$

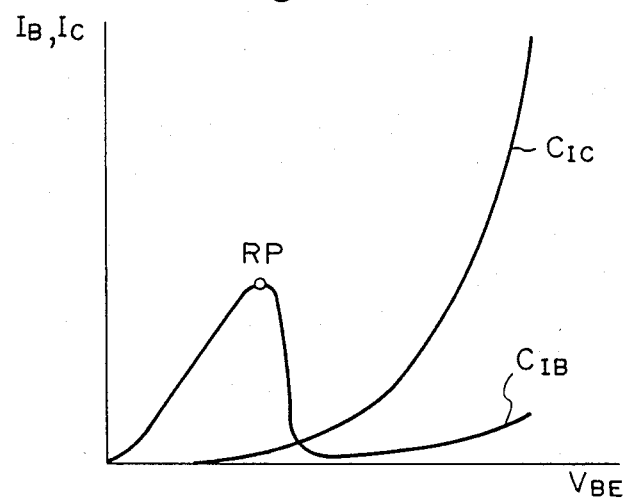

Fig. 18 a  IN  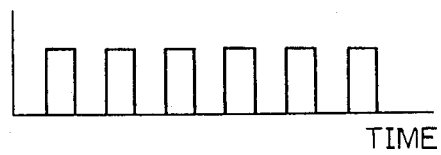
Fig. 18 b  $V_{N21}$  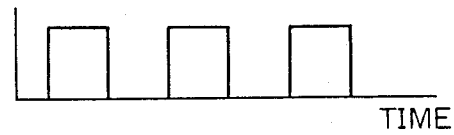
Fig. 18 c  $V_{N22}$  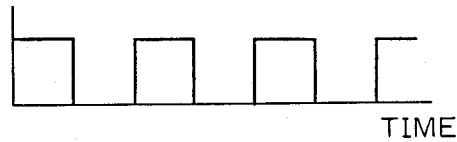
Fig. 18 d  $V_{N23}$  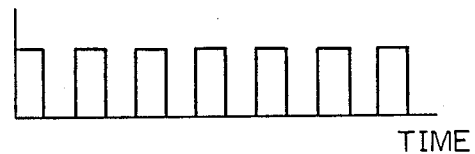
Fig. 18 e  OUT  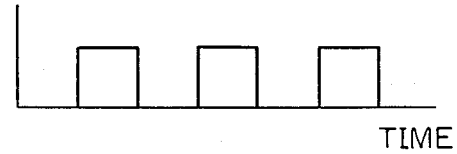

LOGIC CIRCUIT USING RESONANT-TUNNELING TRANSISTOR

BACKGROUND OF THE INVENTION

1. Field of the Invention

The present invention relates to a logic circuit using resonant-tunneling transistors which include resonant-tunneling hot electron transistors (RHETs) and resonant-tunneling bipolar transistors (RBTs). More particularly, it relates to a latch circuit, a memory cell, and a frequency dividing circuit with a simple circuit construction, a high operation speed, and an extremely stable operation.

2. Description of the Related Arts

Latch circuits, memory cells and frequency dividers using bipolar transistors and/or metal insulation semiconductor (MIS) transistors have been extensively used for many years. In the prior art, however, a practical static memory cell requires at least two conventional transistors, and practical frequency dividers require at least three conventional transistors. As a result, the prior art memory cells and frequency dividers suffer from the disadvantages of a complex circuit arrangement, and accordingly, a low integration density. These circuits also suffer from a disadvantage of a low operation speed.

Memory cells using diodes having a differential negative-resistance characteristic are also known in the prior art. These memory cells feature a simple circuit arrangement but have a poor operation stability.

Conversely, although a higher potentiality of three terminal resonant-tunneling devices have long been recognized, they cannot be realized in practice due to the difficulties involved in the relevant semiconductor processing technology. Recently, due to advances in aspects of semiconductor processing technology, such as molecular beam epitaxy (MBE) and metal organic chemical vapor deposition (MOCVD), practical resonant-tunneling transistors have been developed (e.g., "RESONANT-TUNNELING HOT ELECTRON TRANSISTORS (RHET): POTENTIAL AND APPLICATIONS", N. Yokoyama, et al., Japanese Journal of Applied Physics, Vol. 24, No. 11, November 1985, pps. L853–L854).

SUMMARY OF THE INVENTION

An object of the present invention is to provide a latch circuit with a simple circuit arrangement, a reduced circuit size, and a stable and high speed operation, by using a rersonant-tunneling transistor, e.g., a resonant-tunneling hot electron transistor (RHET) and a resonant-tunneling bipolar transistor (RBT).

Another object of the present invention is to provide a memory cell with a simple circuit arrangement, a reduced circuit size, and a stable and high speed operation, also by using a resonant-tunneling transistor.

Still another object of the present invention is to provide a frequency dividing circuit with a stable, high speed operation, a simple circuit, and a reduced circuit size, by using at least one resonant-tunneling transistor.

Yet another object of the present invention is to provide a latch circuit and a memory cell having multilevel stable states.

According to the present invention, there is provided a logic circuit including a resonant-tunneling transistor including a superlattice containing at least one quantum well layer, and a constant current source operatively connected between a base and an emitter of the transistor and supplying a constant current to the base. The transistor has a differential negative-resistance characteristic with at least one resonant point in a relationship between a current flowing into the base and a voltage between the base and emitter, and at least two stable base current values at both sides of the resonant point on the characteristic, defined by the changeable base emitter voltage.

The resonant-tunneling transistor may be a resonant-tunneling hot electron transistor (RHET) or a resonant-tunneling bipolar transistor (RBT).

The logic circuit may further include a load unit operatively connected to a collector of the transistor, and an output circuit connected to a common connection point of the load unit and the collector for outputting a voltage defined by the change of a current flowing through the collector. The voltage is varied in response to the two stable base current values.

According to the present invention, there is also provided a logic circuit including the above transistor, the above constant current source, and a write unit operatively connected to a collector of the transistor for changing a voltage at the collector.

The write unit changes the collector voltage to change a current flowing through the collector. The base-emitter voltage is changed in response to the change of the collector voltage, so that the transistor holds one of at least two stable states defined by the stable base current values in response to the change of collector voltage.

According to the present invention, there is further provided a semiconductor memory device including a plurality of memory cells arranged between a plurality of bit lines and a plurality of word lines in a matrix. Each memory cell includes the above-mentioned latch circuit for latching data and a switching element operatively connected between a commonly connected point of the collector and the resistor in the current supply source and a corresponding bit line and having a control terminal operatively connected to a corresponding word line. The transistor holds one of at least two stable states in response to the change of a voltage at the collector supplied through the switching element in a combination of voltages on the bit line and the word line, and the transistor outputs one of at least two voltages corresponding to the held stable states to the bit line through the switching element energized by a voltage on the word line.

According to the present invention, there is also provided a latch circuit including the above-mentioned transistor, the above-mentioned constant current source, and a write unit operatively connected to the base for supplying a write voltage to the base. The write unit supplies one of at least two write voltages corresponding to the stable base current values to the base to change the base-emitter voltage so that the transistor holds one stable state defined by the changed base-emitter voltage, and the latch circuit outputs a current at the collector which changes in response to the state held in the transistor.

The latch circuit may further include a circuit connected to the collector and supplies a current to the collector through a resistor therein. The latch circuit outputs a voltage at the collector in response to the state held in the transistor. The write unit may include a switching element having a terminal operatively connected to the base and another terminal receiving a data signal and a control terminal receiving a control signal for energizing the write unit. The switching element outputs a data signal having one amplitude, composed of at least two amplitudes corresponding to the stable base current values, to the base in response to the control signal to change the base-emitter voltage, so that the transistor holds one stable state defined by the changed base-emitter voltage.

An input signal having a predetermined frequency and an amplitude, composed of at least two amplitudes corresponding to the stable base current values, is supplied to the clock input terminal, so that an output signal that is half of the input frequency is output from the collector. The signal input circuit may include a switching element having a terminal operatively connected to the base and another terminal as the data input terminal and a control terminal as the clock input terminal.

According to the present invention, there is provided a dynamic frequency divider including the above-mentioned transistor, the above-mentioned constant current source, the above-mentioned collector current supplying unit, and a signal input circuit operatively connected to the base and having a data input terminal and a clock input terminal. The data input terminal and the collector are connected.

According to the present invention, there is provided a static frequency divider including a first delay-type flip-flop (D-FF) having a clock input terminal receiving an input signal, a second D-FF having a data input terminal operatively connected to a positive output terminal of the first D-FF, a first inverter provided between the clock input terminal of the first D-FF and a clock input terminal of the second FF, and a second inverter operatively connecting a positive output terminal of the second FF and a data input terminal of the first D-FF, each D-FF including the latch circuit of the above dynamic frequency divider.

According to the present invention, there is provided a semiconductor memory device including a plurality of memory cells arranged between a plurality of memory cells arranged between a plurality of write lines, a plurality of read lines, and a plurality of address lines in a matrix. Each memory cell includes the above-mentioned latch circuit, a write unit having a terminal operatively connected to the base, another terminal operatively connected to a corresponding write line and a control terminal connected to a corresponding address line, and a read unit operatively connected between the collector and the corresponding address line.

During a write operation, a voltage on the address line is supplied to the control terminal of the write unit to energize the write unit, and a voltage on the write line having an amplitude, composed of at least two amplitudes corresponding to the stable base current values, is supplied to the base through the write unit so that the transistor holds one stable state defined by the amplitude. During a read operation, a voltage corresponding to data held in the transistor is output on the read line through the read unit. The write unit may include a switching transistor having a terminal operatively connected to the base, another terminal operatively connected to a corresponding write line, and a control terminal connected to a corresponding address line.

The read unit may include a switching transistor having a terminal operatively connected to the collector, another terminal operatively connected to a corresponding read line, and a control terminal connected to a corresponding address line. The read unit may also include a coupling capacitor operatively connected between the collector and a corresponding read line.

BRIEF DESCRIPTION OF THE DRAWINGS

Other objects and features of the present invention will be described below in detail with reference to the accompanying drawings, in which:

FIG. 2b is a graph of an energy band of the RHET shown in FIG. 2a;

FIGS. 3a to 3c are qraphs of energy levels of the RHET shown in FIG. 2a;

FIG. 4 is a graph of the characteristic of the RHET shown in FIG. 2a;

FIGS. 8a to 8c are timing charts of the memory cell shown in FIG. 5;

FIG. 12 is a graph representing the basic characteristic of the memory cell shown in FIG. 10;

FIGS. 18a to 18e are timing charts of the operation of the static frequency divider shown in FIG. 17.

DESCRIPTION OF THE PREFERRED EMBODIMENTS

Before describing the preferred embodiments of the present invention, a description will be given of the prior art.

Figure 1:
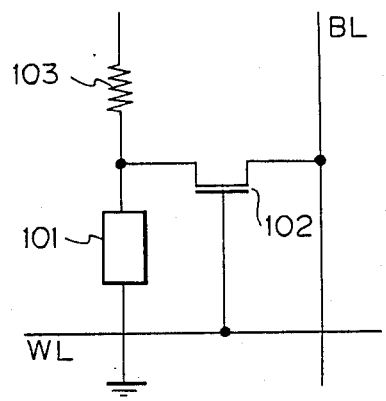
FIG. 1 is a circuit diagram of a semiconductor memory of the prior art.

FIG. 1 is a circuit diagram of a semiconductor memory of the prior art using a diode having a negative-resistance characteristic. The semiconductor memory includes a diode 101 having a negative-resistance characteristic, a load resistor 103 connected to the diode 101, and a transfer gate 102 having a gate connected to a word line WL and a source connected to a bit line BL. The semiconductor memory carries out the read and write operations by using the negative resistance feature of the diode, and thus functions as a memory but does not provide a stable information storage. This is because the read and write operations are effected by using the same circuit. Namely, in the read operation, a current is extracted from the diode 101 through the transfer gate 103 and a current for restoring the content is again given to the diode 101 through the transfer gate 103.

Also, before describing the preferred embodiments of the present invention, a description will be given of a principle of a RHET according to the present invention.

Figure 2B:
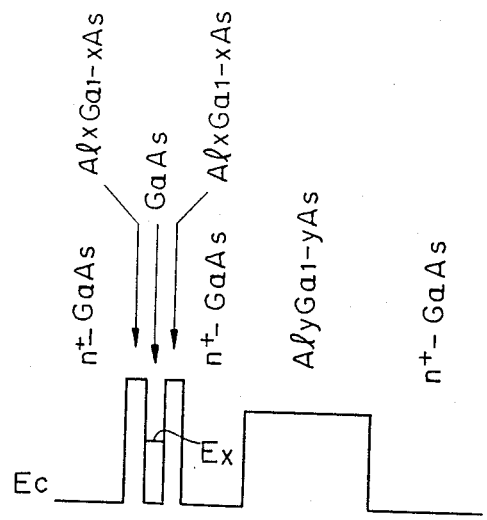
Figure 2A:
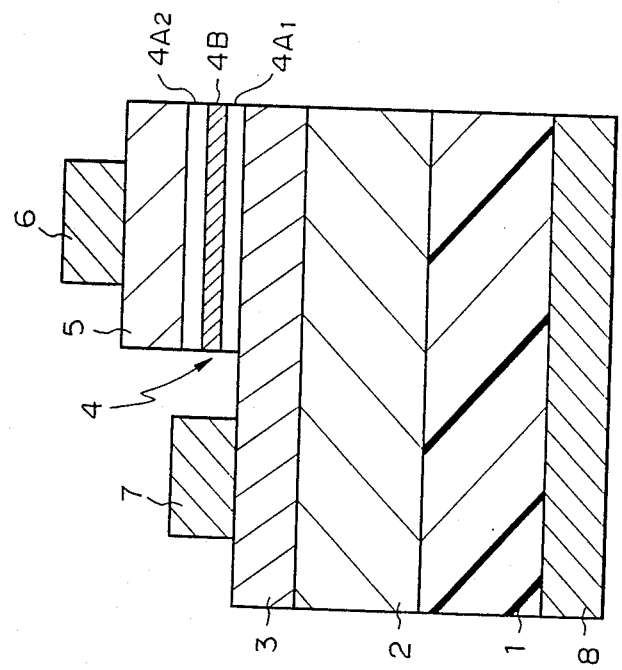
FIG. 2a is a sectional view of a semifinished resonant-tunneling hot electron transistor (RHET) of the present invention.

FIG. 2a is a sectional view of a semifinished RHET, and FIG. 2b is a graph of an energy band of the RHET shown in FIG. 2a. In FIG. 2a, the RHET consists of a collector electrode 8, an n+-type GaAs collector layer 1 formed on the collector electrode 8, a non-doped impurity $Al_yGa_{l-y}As$ (e.g. y=0.3) collector side potential barrier layer 2 formed on the collector layer 1, an n+-type GaAs base layer 3 formed on the potential barrier layer 2, a superlattice layer 4, an n+-type GaAs emitter layer 5, an emitter electrode 6, and a base electrode 7. The superlattice layer 4 consists of an $Al_x$-$Ga_{l-x}As$ barrier layer 4A$_1$, a non-doped impurity GaAs quantum well layer 4B, and an $Al_xGa_{l-x}As$ barrier layer 4A$_2$, and functions as an emitter-side potential barrier. In this specification, although the superlattice is shown as having at least one quantum well provide therein, a plurality of quantum wells may be provided if desired.

In FIG. 2b, reference $E_C$ represents a base of a conduction energy band, $E_F$ a Fermi level, and $E_X$ an energy level of a subband at the quantum well layer 4B.

The principle of the operation of the RHET will now be described with reference to FIGS. 3a to 3c. In the figures, reference $E_{FE}$ represents a pseudo-Fermi level, and $\phi_c$ a conduction-band discontinuity. Note, the numerals 1 to 5, running from right to left at the top of the figures, represent the corresponding layers in the device shown in FIG. 2a.

FIG. 3a is a graph of an energy band of the RHET when a voltage $V_{BE}$ between the base layer 3 and the emitter layer 5 is lower then $2 \cdot E_X/q$; wherein q represents the carrier charges, and is too low, for example, approximately zero volt. In FIG. 3a, although a voltage $V_{CE}$ exists between the collector layer 1 and the emitter layer 3, electrons at the emitter layer 5 cannot reach the base layer 3 by tunneling through the superlattice 4, since the base-emitter voltage $V_{BE}$ is almost zero and thus the level energy in the psuedo Fermi $E_{FE}$ of the emitter layer 5 differs from the sub-band energy level $E_X$. Accordingly, a current does not flow between the emitter layer 5 and the collector layer 1.

FIG. 3b is a graph of an energy band of the RHET when the base emitter voltage $V_{BE}$ is approximately equal to $2 \cdot E_X/q$. Here, the energy level $E_{FE}$ at the emitter layer 5 is substantially equal to the sub-band energy level $E_X$ at the quantum well layer 4B, and because of a resonant-tunneling effect, electrons at the emitter layer 5 are passed through the superlattice layer 4 and injected into the base layer 3. The potential energy of the injected electrons of approximately $2 \cdot E_X$, for example, 0.3 eV, is converted to a kinetic energy, bringing the electrons to a so-called "hot" state. The hot electrons are ballistically passed through the base layer 3 and reach the collector layer 1 if the kinetic energy is higher than the collector barrier level, and as a result, a current flows between the emitter layer 5 and the collector layer 1. If the kinetic energy is lower than the collector barrier level, the electrons cannot reach the collector layer, but they contribute to the base current.

FIG. 3c is a graph of an energy band of the RHET when the base-emitter voltage $V_{BE}$ is higher than $2 \cdot E_X/q$. The energy level $E_{FE}$ at the emitter layer 5 is higher than the sub-band energy level $E_X$ at the quantum well layer 4B. Therefore, the resonant-tunneling effect does not occur, and the electrons from the emitter layer 5 cannot be introduced into the base layer 3. Consequently, the current flowing into the RHET is reduced so that a collector current and/or a base current are decreased.

Figure 4:
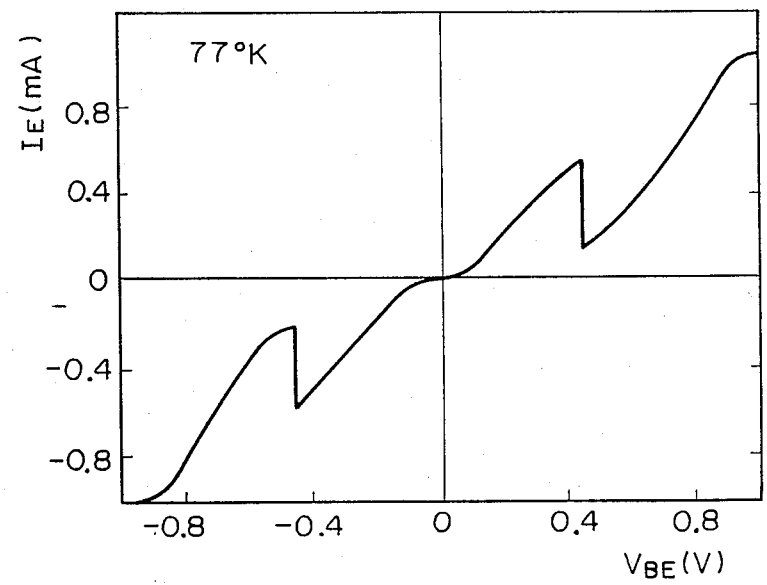

FIG. 4 is a graph representing the characteristic of the RHET set forth above. In FIG. 4, the abscissa indicates the base emitter voltage $V_{BE}$ and the ordinate indicates the emitter current $I_E$. The jagged curve indicates an n-shaped differential negative-resistance characteristic at first and third quadrants, due to the resonant-tunneling effect. Note, the data in FIG. 4 is given at 77° K. and an open collector state.

The present invention uses the above n-differential negative-resistance feature, i.e., n-differential-resistance on the base current.

Figure 5:
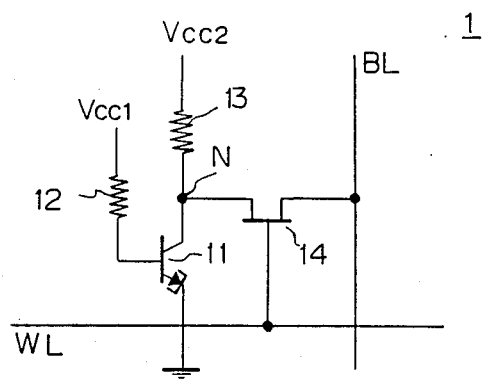
FIG. 5 is a circuit diagram of an embodiment of a semiconductor memory cell of the present invention.

A first embodiment of the present invention will now be described. FIG. 5 is a circuit diagram of a semiconductor memory cell 1. The memory cell 1 includes a RHET 11, a current source resistor 12, a load resistor 13, and a transfer transistor 14 having a gate connected to a word line WL and a source connected to a bit line BL. A base of the RHET 11 is supplied with a positive voltage $V_{CC1}$ through the resistor 12. The resistor 12 functions as a constant current source provided between the base and the emitter of the RHET 11. A collector of the RHET 11 is supplied with a positive voltage $V_{CC2}$ through the resistor 13. The resistor 13 acts as a load, i.e., a dropping resistor.

Figure 6:
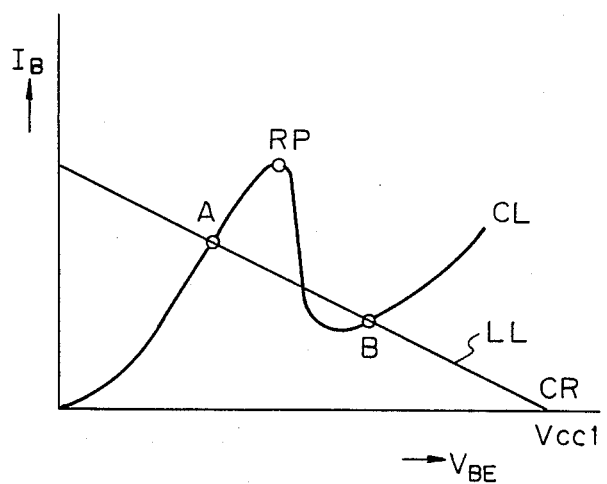
FIG. 6 is a graph representing the characteristic of the memory cell shown in FIG. 5.

FIG. 6 is a graph of the characteristics of the memory cell shown in FIG. 5. In FIG. 6, the abscissa represents the base-emitter voltage $V_{BE}$, and the ordinate represents the base current $I_B$. A curve CL indicates the characteristic of the RHET 11. The characteristic curve CL has an n-shaped negative-differential characteristic of the base-emitter voltage $V_{BE}$ and the base current $I_B$. A first summit point RP in the curve CL represents a resonant-tunneling point. A line LL in the figure indicates a load line defined by the voltage $V_{CC1}$ supplied to the base of the RHET 11 and a resistance value of the load resistor 13. The resistance value defines a gradient of the load line LL. The voltage $V_{CC1}$ defines an intersection CR intersecting the load line LL and the abscissa. The load line LL must be determined such that the line LL intersects a first positive slope line of the characteristic curve CL at a point A and a second positive slope line at a point B, to define bistable states of the memory cell at the points A and B.

Figure 7A:
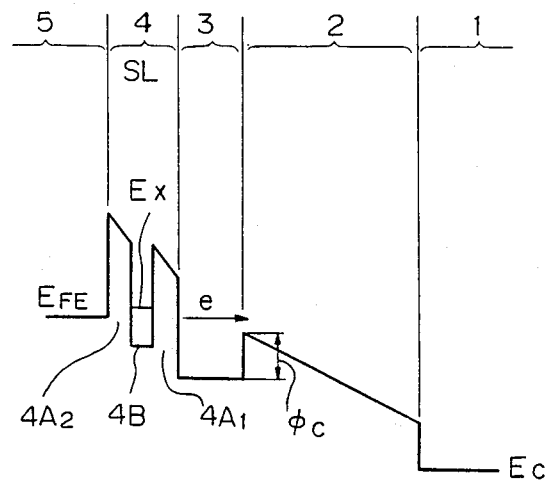
FIGS. 7a and 7b are graphs of energy levels of the RHET in the memory cell shown in FIG. 5.
Figure 7B:
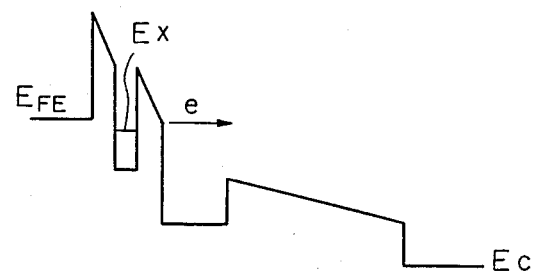

FIGS. 7a and 7b are views representing energy band diagrams. The graph in FIG. 7a represents an energy state at the point A in FIG. 6. The point A is shifted from the resonant-tunneling point RP, the energy state of which is represented in FIG. 3b. Accordingly, the sub-band energyl level $E_X$ at the quantum well layer 4B in FIG. 7a is higher than the energy level $E_{FE}$ at the emitter layer 5. The graph in FIG. 7b corresponds to the graph in FIG. 3c, but the difference between the energy levels at the emitter layer 5 and the collector layer 1 is smaller than that of FIG. 3c. In both states at points A and B, a certain amount of electrons can reach the base layer 3 and the collector layer 1 from the emitter layer 5, and consequently, currents corresponding to the above electrons can flow therein. Here, the resistance value $R_B$ of the current resistor 12 is 1.5 KΩ, the resistance value $R_L$ of the load resistor 12 is 10 KΩ, the voltage $V_{CC1}$ of the constant current source is 1V, and the voltage $V_{CC2}$ of the load is 1V.

The operation of the semiconductor memory cell in FIG. 5 will be described with reference to FIGS. 8a, 8b, and 8c. In the drawings, the abscissas indicate time. FIG. 8a is a graph of the voltage change $V_{BL}$ of the bit line BL, FIG. 8b is a graph of the voltage $B_{WL}$ of the word line WL, and, FIG. 8c is a graph of the voltage change $V_N$ at a node N forming a common connection point for the collector of the RHET 11, the load resistor 13, and a drain of the transfer transistor 14.

As set forth above, the resistor 12 functions as the current source, and thus the current source 12 outputs a constant voltage between the base and the emitter of the RHET 11. Conversely, a voltage $V_{CE}$ between the collector and the emitter of the RHET 11 may be varied by supplying a varying voltage to the bit line BL at each time of word line WL selections, as shown in FIGS. 8a and 8b.

Figure 9A:
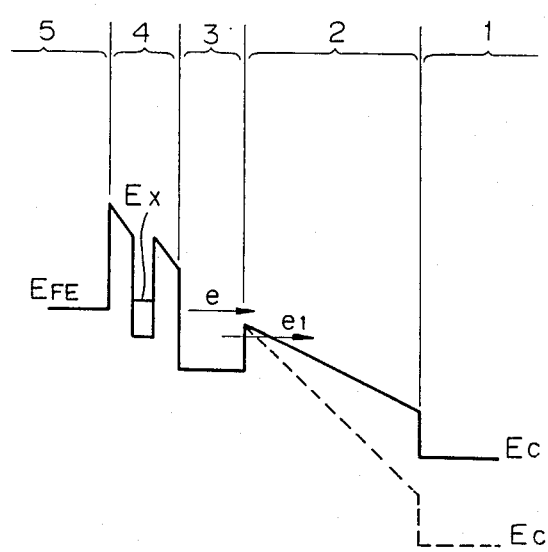
FIGS. 9a and 9b are graphs representing energy levels of the RHET in the in FIG. 5.

The basic operation of the RHET will now be described with reference to FIGS. 9a and 9b. FIG. 9a is an energy-band graph of the RHET when the collector-emitter voltage $V_{CE}$ is positively swung in a large amount to widely separate the energy level $E_{FE}$ at the emitter layer 5 and the energy level $E_C$ at the collector layer 1, as shown by a dotted line. In an energy state as shown by a solid line, electrons e1 cannot reach the collector layer 1 because of a thick barrier at the potential barrier layer 2. On the other hand, in the energy state as shown by the dotted line, the barrier at the potential barrier layer 2 has a thickness which will allow the electrons e1 to tunnel therethrough. Accordingly, the electrons e1 reach the collector layer 1, and thus the base current $I_B$ is reduced and, therefore, the base-emitter voltage $V_{BE}$ is increased. Here, the stable state at point B shown in FIG. 6 may be obtained.

Figure 9B:
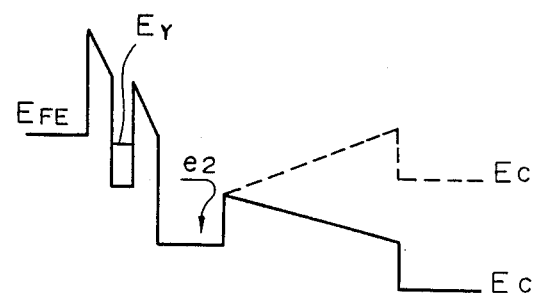

FIG. 9b is a graph illustrating an energy-band of the RHET when the collector-emitter voltage $V_{CE}$ is swung between approximately zero volts and a normal value. A solid line in the figure indicates a normal state, and a dotted line indicates a normal state wherein the collector-emitter voltage $V_{CE}$ is approximately zero volts, and thus, when the difference between the emitter layer energy level $E_{FE}$ and the collector layer energy level $E_C$ is small, the potential barrier at the potential barrier layer 2 is raised as shown by the dotted line. Electrons e2 reaching the collector layer 1 in the normal state are reflected at the potential barrier of the potential barrier layer 2 and reach the base layer 3. As a result, the base current $I_B$ is increased, and thus the base-emitter voltage $V_{BE}$ is reduced. Here, the stable state at point A may be obtained.

By varying the potential at the collector of the RHET 11, the base current $I_B$ of the RHET 11 flows in or out, resulting in a change in the base voltage. Accordingly, the bistable state may be controlled and used for a memory function.

Referring back to FIGS. 8a to 8c, during a time $t_1$, the bit line BL is supplied with the voltage $V_{BL}$ of 0.5V and the word line WL is supplied with the voltage $V_{WL}$ of 1.0V. The transfer transistor 14 is turned ON by a high level of the voltage $V_{WL}$, and the voltage $V_N$ at the node N is brought to approximately 0.4V. This state corresponds to that of the dotted line in FIG. 9a. During a time $t_2$, the bit line BL is supplied with the voltage $V_{BL}$ of zero volt, the word line WL is supplied with the voltage $V_{WL}$ of 1.0V, and the transfer transistor 14 is turned ON by the high level of the voltage $V_{WL}$. Since, however, the voltage $V_{BL}$ of the bit line BL is zero volts, the voltage $V_N$ at the node N is approximately 0.1V. This state corresponds to that shown by the dotted line in FIG. 9b.

Compared with the memory cell in FIG. 5 and the memory in FIG. 1, the principle of the memory storage operation is similar. It should be noted, however, that in the read operation, the memory cell in FIG. 5 is supplied with a current through the load resistor 13 connected to the collector of the RHET 11, and is independent of the current source 12 supplying a current for maintaining either the state at point A or the state at point B. Accordingly, the read operation of the memory cell in FIG. 5 can be carried out while stably maintaining a content stored in the memory cell. In addition, compared with the memory cell in FIG. 5 and a conventional static memory cell, the memory cell can be realized by a single storage RHET 11 and a single transfer transistor 14, compared with the conventional static memory cell which requires at least four transistors, i.e., two storage transistors and two transfer transistors. In this respect, the circuit of the memory cell in FIG. 5 is simpler than that of the conventional static memory cell. This contributes to a higher integration density and a further increase in the speed of operation of the semiconductor memory device because of the use of a high speed RHET.

In the above description, the RHET 11 has only one sub-band energy level $E_X$. Nevertheless, the RHET 11 may have a plurality of sub-band energy levels, and in this case, a characteristic curve may have a plurality of resonant-point peaks and a plurality of valleys. A plurality of memory cell states can be realized by using a RHET, and accordingly, a multi-level memory cell can be realized. In addition, the RHET 11 may have a plurality of quantum wells.

Figure 2C:
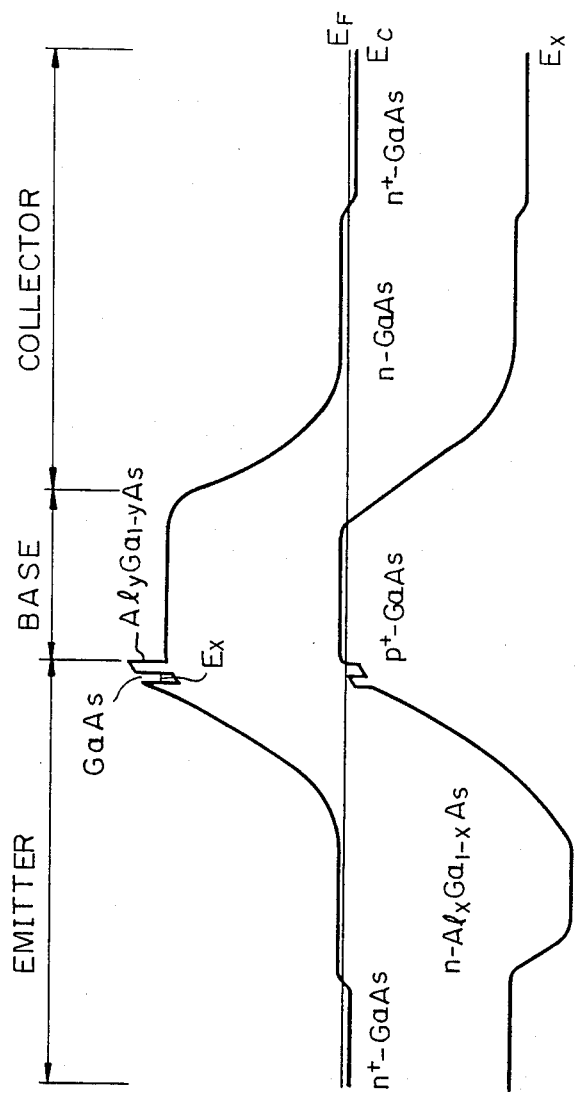
FIG. 2c is a graph representing an energy-band of a resonant-tunneling bipolar transistor (RBT)

The RHET of the present invention may have a PN junction barrier instead of the collector barrier formed by the heterojunction as shown in FIG. 2a. FIG. 2c is a graph representing an energy band of a resonant-tunneling bipolar transistor (RBT). The RBT consists of an emitter layer of $n^+$-type GaAs, a base layer of $p^+$-type GaAs, and a collector layer of $n^+$-type GaAs. The emitter layer includes a superlattice having at least one quantum well with a sub-band energy Ex. The base layer and the collector layer are PN-joined. The RBT also applies a resonant-tunneling effect. The principle of operation is similar to that of the RHET, and thus is omitted.

Furthermore, a RHET wherein positive holes are resonant-tunneled may be used instead of the RHET wherein electrons are resonant-tunneled. The resonant-tunneling of holes cause the negative differential resistance in a base current.

The above memory cell includes a latch circuit of the RHET. Accordingly, it should be understood that a latch circuit using a RHET can also be realized easily, according to the present invention.

Another embodiment of the present invention will now be described.

Figure 10:
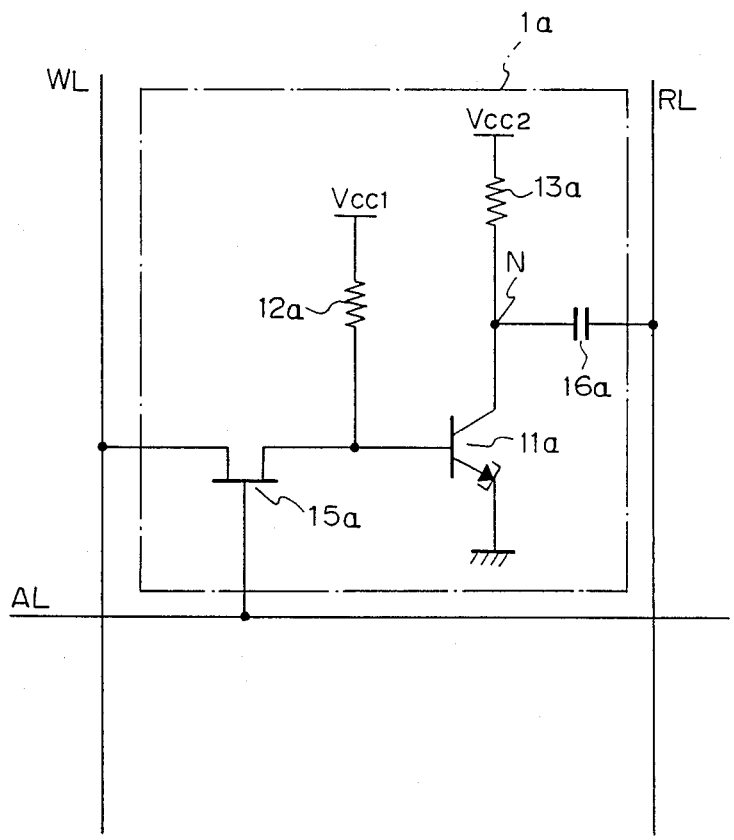
FIG. 10 is a circuit diagram of an embodiment of a delay-type flip-flop (D-FF) of present invention.

FIG. 10 is a circuit diagram of a delay type flip-flop (D-FF) 20 of this embodiment. The D-FF 20 includes a RHET 21, a resistor 22 connected to a base of the RHET 21, a resistor 23 connected to a collector of the RHET 21, and a switching transistor 25. The emitter of the RHET 21 is grounded. The drain of the switching transistor 25 is connected to a data input terminal D, and the gate thereof is connected to a clock pulse input terminal $T_{CP}$. The source of the switching transistor 25, the base of the RHET 21, and the resistor 22 are commonly connected. The resistor 22 supplied a voltage $V_{CC1}$ between the base and the emitter of the RHET 21, and functions as a constant current source, as set forth above. The resistor 23 also supplies a voltage $V_{CC2}$ between the collector and the emitter of the RHET 21, and functions as a negative characteristic resistor. The collector of the RHET 21 is connected to a positive output terminal Q. The D-FF 20 may have at least two stable states, and thus can function as a memory.

The principle and operation of the D-FF 20 will now be described.

Figure 11:
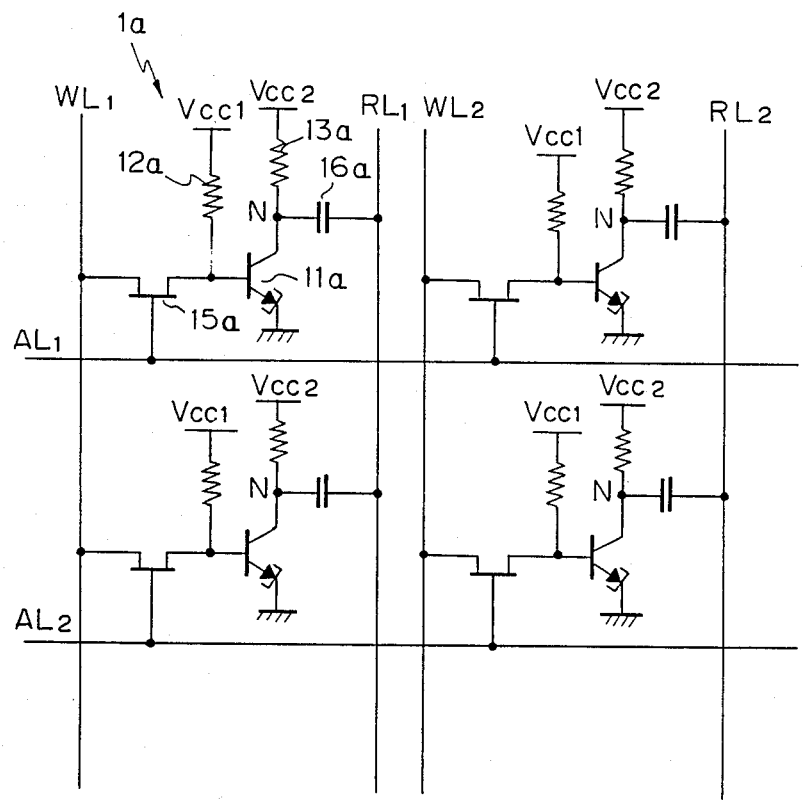
FIGS. 11a to 11d are graphs representing energy levels of the RHET in the D-FF shown in FIG. 10.

Energy states of the RHET 21 in FIG. 10 will now be described with reference to FIGS. 11a to 11d. FIG. 11a corresponds to FIG. 3a; that is, the base emitter voltage $V_{BE}$ is lower than $2 \cdot E_X/q$, and consequently the sub-band energy level $E_X$ at the quantum well 4B in the superlattice 4 is higher than the energy level $E_{FE}$ at the emitter layer 5. The resonant-tunneling effect does not occur, and thus a current does not pass through the RHET 21. FIG. 11b corresponds to FIG. 3b, and in FIG. 11b, a graph partially represented by a dotted line corresponds to the graph shown in FIG. 3b. In this case, the resonant-tunneling effect occurs, and consequently, a collector current flows. On the other hand, a height of a potential barrier at the collector potential barrier layer 2 on a graph represented by a solid line is higher than $2 \cdot E_X/q$, and thus is higher than that of the element shown by the dotted line. As a result, electrons e pass through the superlattice 4 and are stopped at the collector barrier layer 2. The stopped electrons reach the base layer 3. Accordingly, the base current (not the collector current) flows. FIG. 11c corresponds to FIG. 3c. Here, the energy level $E_{FE}$ at the emitter layer 5 is higher than the sub-band energy level $E_X$, and the resonant-tunneling effect does not exist. Therefore, electrons cannot be injected into the base layer 3 from the emitter layer 5, and thus the base current $I_B$ between the base and the emitter is reduced. FIG. 11d is an energy-band graph of the RHET 21 when the base-emitter voltage $V_{BE}$ is too high, i.e., much higher than $2 \cdot E_X/q$. Here, the energy level $E_{FE}$ at the emitter layer 5 is higher than the sub-band energy level $E_X$ and is comparable with the barrier height of the barrier layer $4A_l$. Therefore, electrons e can reach the base layer 3 by directly tunneling and/or by a resonant-tunneling effect. The electrons e have sufficient energy to pass above the collector potential barrier layer 2, and as a result, reach the collector layer 1 and thus the collector current flows.

The above characteristics can be seen in FIG. 12. In FIG. 12, the abscissa indicates the base-emitter voltage $V_{BE}$, and the ordinate indicates the base current $I_B$ and the collector current $I_C$. Curves $C_{IB}$ and $C_{IC}$ represent the characteristics of the base current $I_B$ and the base-emitter voltage $V_{BE}$, and the collector current $I_C$ and the base-emitter voltage $V_{BE}$, respectively. In FIG. 12, a differential negative-resistance characteristic having an n-shape appears on the curve $C_{IB}$. This characteristic may be used as a memory function.

Figure 13:
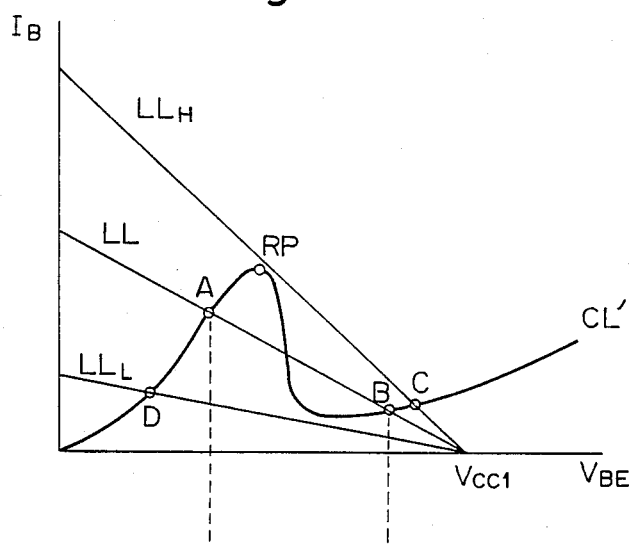
FIGS. 13a and 13b are graphs representing the operating characteristic of the memory cell shown in FIG. 10.
Figure 13:
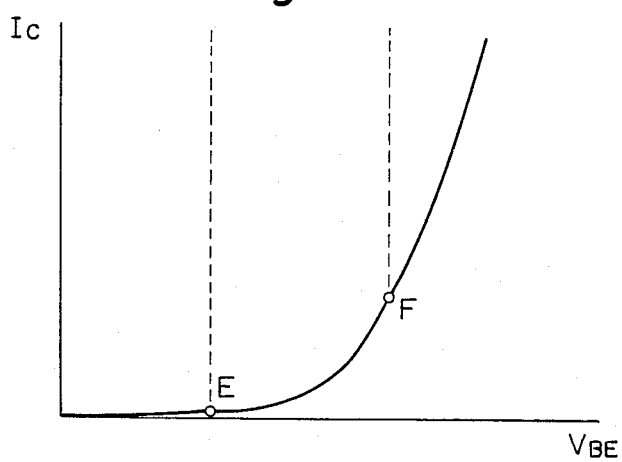

Referring back to FIG. 10, the resistor 22 functions as a constant current source between the base and the emitter of the RHET 21, as described above in the first embodiment. FIG. 13a is a graph corresponding to FIG. 6. In FIG. 13a, a characteristic curve CL' corresponds to the characteristic curve CL in FIG. 6; a first straight line LL is a load line when the switching transistor 25 is turned OFF; a second straight line $LL_H$ is an effective load line when the switching transistor 25 is turned ON and the data input terminal D is supplied with a high voltage; and a third straight line $LL_L$ is an effective load line when the switching transistor 25 is turned ON and the data input terminal D is supplied with a low voltage. The intersections A, B, C and D are stable points, respectively, and the basic relationship between the load lines LL, $LL_H$ and $LL_L$ and the characteristic curve CL' is similar to that in FIG. 6. The voltages $V_{CC1}$ and $V_{CC2}$ are respectively 1V. The resistance value $R_B$ of the constant current source 22 is 1.5KΩ, and, the resistance value $R_L$ of the load resistor 23 is 10KΩ.

When the switching transistor 25 is turned OFF, the RHET 21 may have two stable states at the stable points A and B along the load line LL. As the switching transistor 25 is changed from an OFF state to an ON state, and then restored to an OFF state, when the data input terminal D is a high level, the state of the RHET 21 is transferred to the point B on the load line LL from the point A or B on the load line LL through the point C on the load line $LL_H$. When the data input terminal D is a low level, the state of the RHET 21 is transferred to the point A on the load line LL from the point A or B on the load line LL through the point D on the load line $LL_L$. In this way, by controlling the data input terminal D and the clock pulse input terminal $T_{CP}$, the status of the RHET 21 can be changed between the bistable points A and B.

FIG. 13b is a graph of the characteristics of the RHET 21, wherein the base emitter voltage $V_{BE}$ is shown by the abscissa and the collector current $I_C$ is shown by the ordinate. Points E and F on a curve of the collector current correspond to the bistable points A and B in FIG. 13a. At point B, a large amount of the collector current $I_C$ flows, and as a result, a voltage at the collector of the RHET is low. Conversely, at point A, the collector voltage is high.

From the above, during the write operation, by maintaining a constant supply of a high level voltage to the clock pulse input terminal $T_{CP}$ and the positive output terminal Q, a high level data, i.e., a logic "1", can be stored in the RHET 21 by supplying a high level voltage to the data input terminal D, or a low level data, i.e., a logic "0", can also be stored therein by supplying a low level voltage, i.e., zero volts, to the data input terminal D. Therefore, during the write operation in this embodiment, the write signal is applied to the base so as to charge the voltage level $V_{BE}$ in the RHET. This point is different from the first embodiment in FIG. 5 in which the write signal is applied to the collector.

Figure 14:
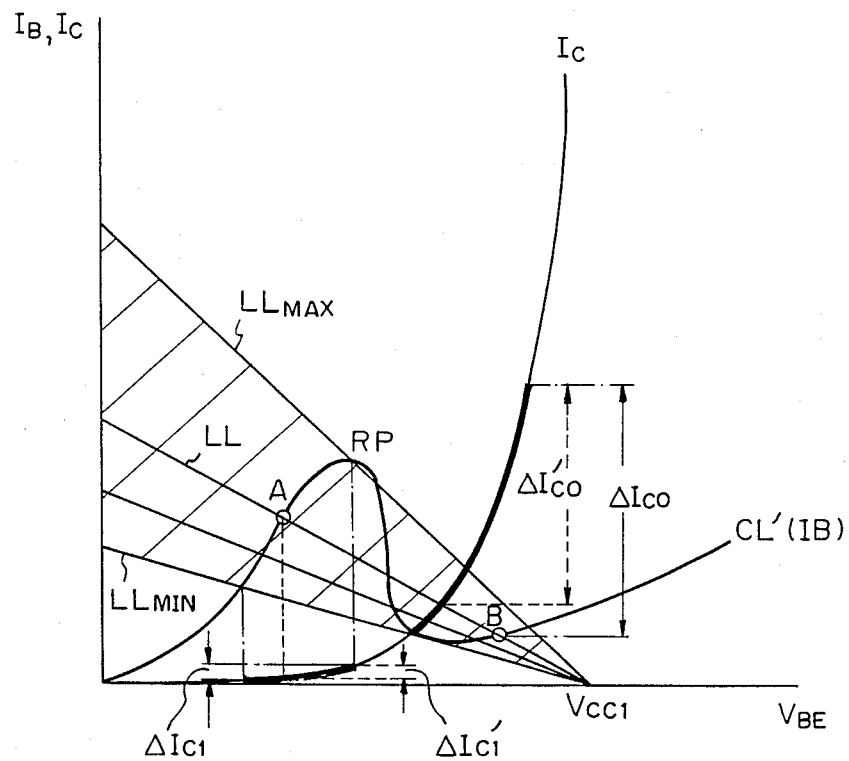
FIG. 14 is a graph illustrating the operation of the memory cell shown in FIG. 10.
Figure 10:
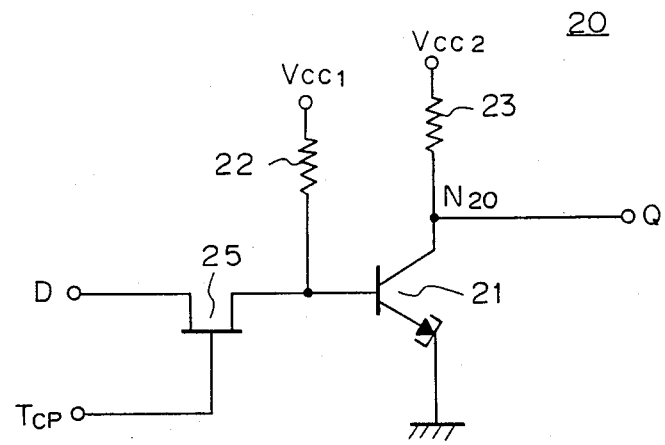

Next, the read operation will be described with reference to FIG. 14. FIG. 14 is a view combined with FIGS. 13a and 13b. When the switching transistor 25 is kept in an ON state, the voltage supplied to the data input terminal D changes in a shaded range which does not change the store status in the RHET 21. When the state of the RHET 21 lies at point A, the collector current change $\Delta I_{CI}$ is small, as shown by a bold line. On the other hand, when the state of the RHET 21 lies at point B, the change $\Delta I_{C0}$ of the collector current $I_C$ is large, as shown by another bold line. The above current change will change the voltage $V_{N20}$ at the node $N_{20}$.

Figure 15:
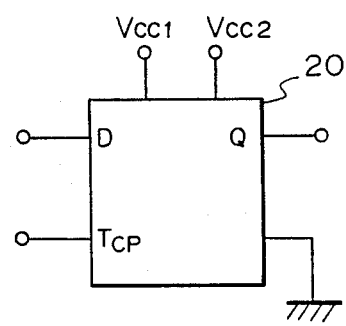
FIG. 15 is a block diagram representing the circuit shown in FIG. 10.

In order to activate the D-FF, the RHET 21 has an n-shaped differential negative-resistance feature. A logic signal "1" or "0" is supplied to the data input terminal D, and a clock pulse is input to the clock pulse input terminal $T_{CP}$. After one clock pulse has elapsed, an output signal corresponding to the signal supplied to the data input terminal D appears at a node $N_{20}$. Therefore, the circuit in FIG. 10 functions as a D-FF. FIG. 15 is a block diagram of the D-FF shown in FIG. 10.

Figure 16:
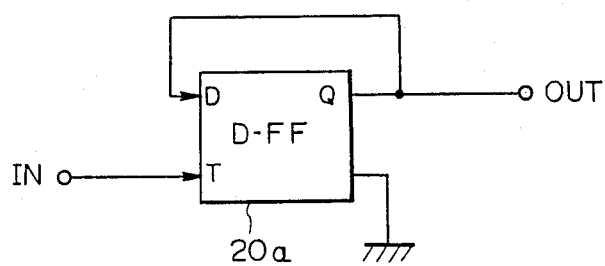
FIG. 16 is a block diagram of a dynamic frequency divider using the D-FF shown in FIG. 10.

FIG. 16 is a block diagram of a dynamic frequency divider 21 using the D-FF 20a shown in FIG. 15. Here, the data input terminal D and the output terminal Q are connected, and an input signal IN having a frequency f is divided into output signals OUT having the frequency f/2.

The dynamic frequency divider 21 is realized by providing two transistors 21 and 25 as shown in FIG. 10, and is stable in operation. In comparison, the conventional dynamic frequency divider requires at least three transistors. In addition, the dynamic frequency divider 21 can operate at a high speed, since the RHET 21, which can operate stably at a high speed is used herein.

Figure 17:
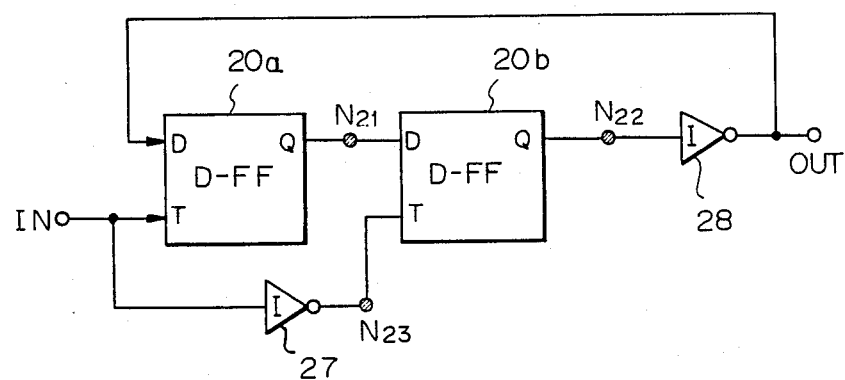
FIG. 17 is a block diagram of a static frequency divider used the D-FF shown in FIG. 10.
Figure 16A:
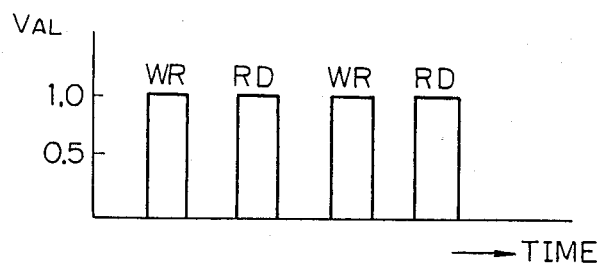
Figure 16B:
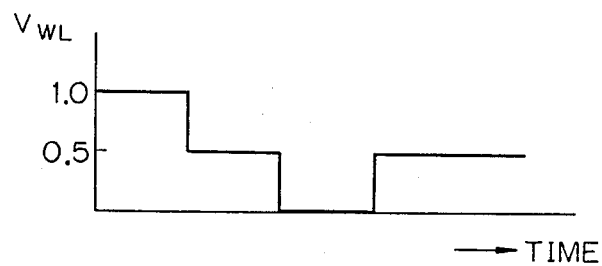
Figure 16C:
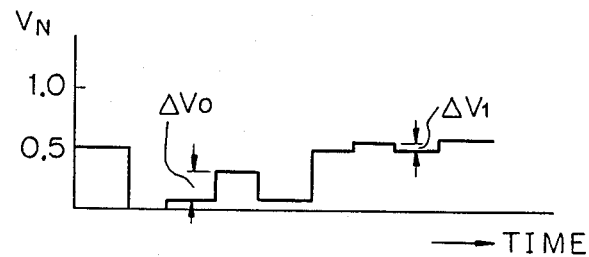
Figure 17:
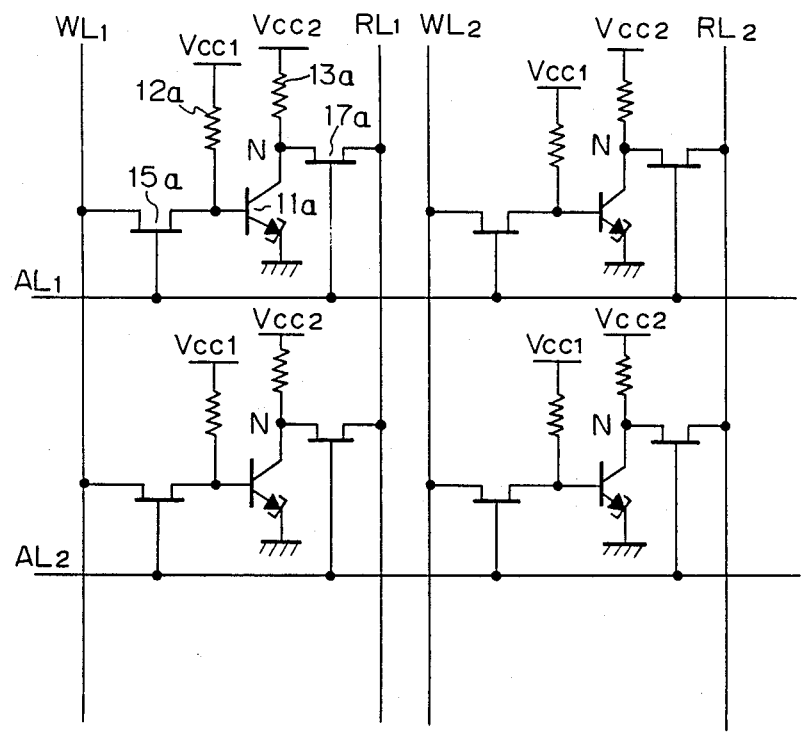

FIG. 17 is a block diagram of a static frequency divider 22. The static frequency divider 22 includes two D-FFs 20a and 20b both having the circuit construction shown in FIG. 10, and two inverters 27 and 28.

FIGS. 18a to 18e are timing charts of the static frequency divider 22. FIG. 18a is a graph of the input pulse signal IN, FIGS. 18b to 18d are graphs of voltages $V_{N21}$, $V_{N22}$ and $V_{N23}$ at nodes N21, N22 and N23, and FIG. 18e is a graph of the output pulse signal OUT. The input pulse signal IN having the frequency f is divided into the output pulse signals OUT having the frequency f/2.

The transistor 14 in FIG. 5 and the transistor 25 in FIG. 10 can be replaced by a RHET functioning as a high speed switching transistor.

Many widely different embodiments of the present invention may be constructed without departing from the spirit and scope of the present invention. It should be understood that the present invention is not limited to the specific embodiments described in this specification, except as defined by the appended claims.

We claim:

1. A logic circuit comprising:
   a resonant-tunneling transistor including a superlattice containing at least one quantum well layer; and
   means serially connected to a junction between a base and an emitter of said transistor and supplying a constant current to said base;
   said transistor having a differential negative-resistance characteristic with at least one resonant point in a relationship between a current flowing through said base and a voltage between said base and emitter, and having at least two stable base current values at both sides of said resonant point on said characteristic, defined by said changeable base emitter voltage.

2. A logic circuit according to claim 1, further comprising load means operatively connected to a collector of said transistor, and output means operatively connected to a commonly connected point of said load means and said collector, for outputting a voltage defined by a change of a current flowing through said collector, which voltage is varied in response to said two stable base current values.

3. A logic circuit according to claim 2, wherein said resonant-tunneling transistor comprises a resonant-tunneling hot electron transistor.

4. A logic circuit according to claim 2, wherein said resonant-tunneling transistor comprises a resonant-tunneling bipolar transistor.

5. A logic circuit comprising:
   a resonant-tunneling transistor having a superlattice containing at least one quantum well layer;
   means serially connected to a junction between a base and an emitter of said transistor for supplying a constant current to said base; and
   write means operatively connected to a collector of said transistor for changing a voltage at said collector,
   said transistor having a differential negative-resistance characteristic having at least one resonant point of a resonant-tunneling effect in a relationship between a current flowing through said base and a voltage between said base and emitter, and having at least two stable base current values at both sides of said resonant point, defined by said base.emitter voltage,
   said write means changing the collector voltage to change a current flowing through said collector and said base.emitter voltage being changed in response to the change of said collector voltage, so that said transistor holds one of at least two stable states defined by said stable base current values in response to said change of said collector voltage.

6. A logic circuit according to claim 5, wherein said resonant-tunneling transistor comprises a resonant-tunneling hot electron transistor.

7. A logic circuit according to claim 5, wherein said resonant-tunneling transistor comprises a resonant-tunneling bipolar transistor.

8. A semiconductor memory device comprising a plurality of memory cells arranged between a plurality of bit lines and a plurality of word lines in a matrix fashion,
   each memory cell including,
   an resonant-tunneling transistor having a superlattice containing at least one quantum well layer,
   means serially connected to a junction between a base and an emitter of said transistor for supplying a constant current to said base,
   means operatively connected to a collector of said transistor and supplying a current flowing through said collector via a resistor therein, and
   a switching means operatively connected between a commonly connected point of said collector and said resistor in said current supply means and a corresponding bit line and having a control terminal operatively connected to a corresponding word line,
   said transistor having a differential negative-resistance characteristic having at least one resonant point of a resonant-tunneling effect in a relationship between a current flowing through said base and a voltage between said base and emitter, and having at least two stable base current values at both sides of said resonant point, defined by said base.emitter voltage,
   said transistor holding one of at least two stable states in response to the change of a voltage at said collector supplied through said switching means in a combination of voltages on said bit line and said word line, and
   said transistor outputting one of at least two voltages corresponding to said held stable states to said bit line through said switching means energized by a voltage on said word line.

9. A semiconductor memory device according to claim 8, wherein said resonant-tunneling transistor comprises a resonant-tunneling hot electron transistor.

10. A semiconductor memory device according to claim 8, wherein said resonant-tunneling transistor comprises a resonant-tunneling bipolar transistor.

11. A latch circuit comprising:
a resonant-tunneling transistor including a superlattice containing at least one quantum well layer;
means serially connected to a junction between a base and an emitter of said transistor for supplying a constant current to said base; and
write means operatively connected to said base and supplying a write voltage to said base;
said transistor having a differential negative-resistance characteristic having at least one resonant point of a resonant-tunneling effect in a relationship between a current flowing through said base and a voltage between said base and emitter, and having at least two stable base current values at both sides of said resonant point, defined by said base.emitter voltage,
said write means supplying one of at least two write voltages corresponding to said stable base current values to said base to change said base. emitter voltage so that the transistor holds one stable state defined by said changed base.emitter voltage.

12. A latch circuit according to claim 11, wherein said latch circuit outputs a current at said collector which is changeable in response to said state held in said transistor.

13. A latch circuit according to claim 12, further comprising means connected to said collector and supplying a current to said collector through a resistor therein, wherein said latch circuit outputs a voltage at said collector in response to said state held in said transistor.

14. A latch circuit according to claim 11, further, comprising means connected to said collector and supplying a current to said collector through a resistor therein, wherein said latch circuit outputs a voltage at said collector in response to said state held in said, transistor.

15. A latch circuit according to claim 11, wherein said resonant-tunneling transistor comprises a resonant-tunneling hot electron transistor.

16. A latch circuit according to claim 11, wherein said resonant-tunneling transistor comprises a resonant-tunneling bipolar transistor.

17. A latch circuit comprising:
a resonant-tunneling transistor including a superlattice containing at least one quantum well layer;
means serially connected to a junction between a base and an emitter of said resonant-tunneling transistor for supplying a constant current to said base; and
write means operatively connected to said base and supplying a write voltage to said base, said write means including:
switching means having a first terminal operatively connected to said base, a second terminal for receiving a data signal and a control terminal for receiving a control signal for energizing said switching means, said switching means sending the data signal having one amplitude of at least two amplitudes corresponding to the stable base current values, to said base in response to the control signal for changing the base emitter voltage such that said transistor holds one stable state defined by the changed base emitter voltage;
said transistor having a differential negative-resistance characteristic having at least one resonant point of a resonant-tunneling effect in a relationship between a current flowing through said base and a voltage between said base and emitter, and having at least two stable base current values at both sides of said resonant point defined by said base emitter voltage; and
said write means supplying one of at least two write voltages corresponding to the stable base current values, to said base for changing the base emitter voltage such that said transistor holds one stable state defined by the changed base emitter voltage.

18. A dynamic frequency divider comprising:
a resonant-tunneling transistor including a superlattice containing at least one quantum well layer;
means serially connected to a junction between a base and an emitter of said transistor for supplying a constant current to said base;
means operatively connected to a collector and supplying a current flowing through said collector through a resistor therein; and
signal input means operatively connected to said base and having a data input terminal and a clock input terminal;
said data input terminal and said collector being connected,
said transistor having a differential negative-resistance characteristic having at least one resonant point of a resonant-tunneling effect in a relationship between a current flowing through said base and a voltage between said base and emitter, and having at least two stable base current values at both sides of said resonant point, defined by said base.emitter voltage,
an input signal having a predetermined frequency and an amplitude of at least two amplitudes corresponding to said stable base current values, being supplied to said clock input terminal so that an output signal of a half of said input frequency is output from said collector.

19. A dynamic frequency divider according to claim 18, wherein said signal input means includes switching means having a terminal operatively connected to said base and another terminal as said data input terminal and a control terminal as said clock input terminal.

20. A dynamic frequency divider according to claim 18, wherein said resonant-tunneling transistor comprises a resonant-tunneling hot electron transistor.

21. A dynamic frequency divider according to claim 18, wherrein said resonant-tunneling transistor comprises a resonant-tunneling bipolar transistor.

22. A static frequency divider comprising:
a first delay-type flip-lop (D-FF), having a clock input terminal receiving an input signal;
a second D-FF having a data input terminal operatively connected to an positive output terminal of said first D-FF;
a first inverter provided between said clock input terminal of said first D-FF and a clock input terminal of said second FF; and
a second inverter operatively connecting a positive output terminal of said second FF and a data input terminal of said first D-FF;

each D-FF including, a resonant-tunneling transistor including a superlattice containing at least one quantum well layer, means serially connected to a junction between a base and an emitter of said transistor for supplying a constant current to said base, means operatively connected to a collector and supplying a current flowing through said collector through a resistor therein, and signal input means operatively connected to said base and having a data input terminal and a clock input terminal, said transistor having a differential negative-resistance characteristic having at least one resonant point of a resonant-tunneling effect in a relationship between a current flowing through said base and a voltage between said base and emitter, and having at least two stable base current values at both sides of said resonant point, defined by said base.emitter voltage, an input signal having a predetermined frequency and an amplitude of at least two amplitudes corresponding to said stable base current values, being supplied to said clock input terminal of said first D-FF so that an output signal of a half of said input frequency is output from said positive output terminal of said second D-FF.

23. A static frequency divider according to claim 22, wherein said signal input means includes a switching means having a terminal operatively connected to said base and another terminal as said data input terminal and a control terminal as said clock input terminal.

24. A static frequency divider according to claim 23, wherein said resonant-tunneling transistor comprises a resonant-tunneling hot electron transistor.

25. A static frequency divider according to claim 23, wherein said resonant-tunneling transistor comprises a resonant-tunneling bipolar transistor.

* * * * *

UNITED STATES PATENT AND TRADEMARK OFFICE
CERTIFICATE OF CORRECTION

PATENT NO. : 4,849,934
DATED : July 18, 1989
INVENTOR(S) : Nakoki Yokoyama

It is certified that error appears in the above-identified patent and that said Letters Patent is hereby corrected as shown below:

Column 4, line 32, after "the" (second occurrence) insert --memory cell shown--.
Column 6, line 59, "energyllevel" should read --energy level--.
Column 14, line 58, "flip-lop" should read --flip-flop--.

Signed and Sealed this

Eighth Day of May, 1990

*Attest:*

HARRY F. MANBECK, JR.

*Attesting Officer*  *Commissioner of Patents and Trademarks*